(12) United States Patent
Nobbe et al.

(10) Patent No.: US 9,800,211 B2
(45) Date of Patent: *Oct. 24, 2017

(54) HOT CARRIER INJECTION COMPENSATION

(71) Applicant: Peregrine Semiconductor Corporation, San Diego, CA (US)

(72) Inventors: Dan William Nobbe, Crystal Lake, IL (US); Chris Olson, Palatine, IL (US); David Kovac, Arlington Heights, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/188,851

(22) Filed: Jun. 21, 2016

(65) Prior Publication Data

US 2016/0301368 A1    Oct. 13, 2016

Related U.S. Application Data

(63) Continuation of application No. 14/242,373, filed on Apr. 1, 2014, now Pat. No. 9,419,565.

(51) Int. Cl.

| | |
|---|---|
| *H03F 3/04* | (2006.01) |
| *H03F 1/14* | (2006.01) |
| *H03F 1/30* | (2006.01) |
| *H04B 1/44* | (2006.01) |
| *H04B 17/12* | (2015.01) |
| *H04B 7/015* | (2006.01) |
| *H04B 7/02* | (2017.01) |
| *H04B 15/00* | (2006.01) |
| *H04B 1/18* | (2006.01) |

(Continued)

(52) U.S. Cl.
CPC ............ *H03F 1/301* (2013.01); *H03F 1/30* (2013.01); *H03F 3/193* (2013.01); *H03F 3/195* (2013.01); *H03F 3/21* (2013.01); *H03F 3/213* (2013.01); *H04B 1/18* (2013.01); *H04B 1/44* (2013.01); *H04B 1/525* (2013.01); *H04B 7/015* (2013.01); *H04B 7/02* (2013.01); *H04B 15/005* (2013.01); *H04B 17/12* (2015.01); *H04L 27/20* (2013.01); *H03F 3/04* (2013.01); *H03F 2200/18* (2013.01); *H03F 2200/451* (2013.01); *H03F 2200/456* (2013.01); *H03F 2200/471* (2013.01); *H03F 2200/555* (2013.01)

(58) Field of Classification Search
CPC ...................................................... H03F 3/21
USPC .................... 330/296, 277, 285, 301, 311
See application file for complete search history.

(56) References Cited

U.S. PATENT DOCUMENTS

| | | |
|---|---|---|
| 9,419,565 B2 | 8/2016 | Nobbe et al. |
| 2010/0237945 A1 | 9/2010 | Cassia et al. |
| 2015/0280655 A1 | 10/2015 | Nobbe et al. |

OTHER PUBLICATIONS

Nguyen, Khiem D., Office Action received from the USPTO dated Jul. 9, 2015 for U.S. Appl. No. 14/242,373, 14 pgs.

(Continued)

*Primary Examiner* — Khanh V Nguyen
*Assistant Examiner* — Khiem Nguyen
(74) *Attorney, Agent, or Firm* — Jaquez Land Greenhaus LLP; Martin J. Jaquez, Esq.; Alessandro Steinfl, Esq.

(57) ABSTRACT

Methods and devices are described for compensating an effect of aging due to, for example, hot carrier injection, or other device degradation mechanisms affecting a current flow, in an RF amplifier. In one case a replica circuit is used to sense the aging of the RF amplifier and adjust a biasing of the RF amplifier accordingly.

16 Claims, 5 Drawing Sheets

(51) Int. Cl.
*H03F 3/193* (2006.01)
*H03F 3/21* (2006.01)
*H04B 1/525* (2015.01)
*H03F 3/195* (2006.01)
*H03F 3/213* (2006.01)
*H04L 27/20* (2006.01)

(56) References Cited

OTHER PUBLICATIONS

Nguyen, Khiem D., Final Office Action received from the USPTO dated Feb. 26, 2016 for U.S. Appl. No. 14/242,373, 213 pgs.
Nguyen, Khiem D., Notice of Allowance received from the USPTO dated Jun. 6, 2016 for U.S. Appl. No. 14/242,373, 12 pgs.
Nobbe, et al., Response filed in the USPTO dated Nov. 9, 2015 for U.S. Appl. No. 14/242,373, 18 pgs.
Nobbe, et al., Response filed in the USPTO dated Apr. 26, 2016 for U.S. Appl. No. 14/242,373, 10 pgs.
Nobbe, et al., Amendment After Notice of Allowance filed in the USPTO dated Jun. 20, 2016 for U.S. Appl. No. 14/242,373, 3 pgs.

HOT CARRIER INJECTION COMPENSATION

CROSS REFERENCE TO RELATED APPLICATIONS—CLAIM OF PRIORITY

This application is a continuation of co-pending U.S. application Ser. No. 14/242,373 filed Apr. 1, 2014, entitled "Hot Carrier Injection Compensation", the disclosure of which is incorporated herein by reference in its entirety. Application Ser. No. 14/242,373 may be related to U.S. Pat. No. 6,804,502, issued on Oct. 12, 2004 and entitled "Switch Circuit and Method of Switching Radio Frequency Signals", the disclosure of which is incorporated herein by reference in its entirety. Application Ser. No. 14/242,373 may also be related to U.S. Pat. No. 7,910,993, issued on Mar. 22, 2011 and entitled "Method and Apparatus for use in Improving Linearity of MOSFET's using an Accumulated Charge Sink", the disclosure of which is incorporated herein by reference in its entirety. Application Ser. No. 14/242,373 may also be related to U.S. Pat. No. 9,294,056 entitled "Scalable Periphery Tunable Matching Power Amplifier", issued on Mar. 22, 2016, the disclosure of which is incorporated herein by reference in its entirety. Application Ser. No. 14/242,373 may also be related to International Application No. PCT/US2009/001358, entitled "Method and Apparatus for use in digitally tuning a capacitor in an integrated circuit device", filed on Mar. 2, 2009, the disclosure of which is incorporated herein by reference in its entirety. Application Ser. No. 14/242,373 may also be related to U.S. Pat. No. 9,197,194, entitled "Methods and Apparatuses for Use in Tuning Reactance in a Circuit Device", issued on Nov. 24, 2015, the disclosure of which is incorporated herein by reference in its entirety. Application Ser. No. 14/242,373 may also be related to U.S. Pat. No. 9,276,527, issued on Mar. 1, 2016, entitled "Methods and Devices for Impedance Matching in Power Amplifier Circuits", the disclosure of which is incorporated herein by reference in its entirety. Application Ser. No. 14/242,373 may also be related to U.S. Pat. No. 7,248,120, issued on Jul. 24, 2007, entitled "Stacked Transistor Method and Apparatus", the disclosure of which is incorporated herein by reference in its entirety. Application Ser. No. 14/242,373 may also be related to U.S. patent application Ser. No. 13/828,121, filed on Mar. 14, 2013, entitled "Systems and Methods for Optimizing Amplifier Operations", the disclosure of which is incorporated herein by reference in its entirety. Application Ser. No. 14/242,373 may also be related to U.S. patent application Ser. No. 13/967,866 entitled "Tunable Impedance Matching Network", filed on Aug. 15, 2013, the disclosure of which is incorporated herein by reference in its entirety. Application Ser. No. 14/242,373 may also be related to U.S. patent application Ser. No. 13/797,686 entitled "Variable Impedance Match and Variable Harmonic Terminations for Different Modes and Frequency Bands", filed on Mar. 12, 2013, the disclosure of which is incorporated herein by reference in its entirety. Application Ser. No. 14/242,373 may also be related to U.S. Pat. No. 9,331,643 entitled "Methods and Devices for Thermal Control in Power Amplifier Circuits", issued on May 3, 2016, the disclosure of which is incorporated herein by reference in its entirety. Application Ser. No. 14/242,373 may also be related to U.S. patent application Ser. No. 13/829,946 entitled "Amplifier Dynamic Bias Adjustment for Envelope Tracking", filed on Mar. 14, 2013, the disclosure of which is incorporated herein by reference in its entirety. Application Ser. No. 14/242,373 may also be related to U.S. Pat. No. 9,287,829 entitled "Control Systems and Methods for Power Amplifiers Operating in Envelope Tracking Mode", issued on Mar. 15, 2016, the disclosure of which is incorporated herein in its entirety.

BACKGROUND

1. Field

The present teachings relate to RF (radio frequency) circuits. More particularly, the present teachings relate to methods and apparatuses for reducing impact of hot carrier injection in transistors of an RF amplifier when the transistors are subjected to high stress.

2. Description of Related Art

Radio frequency (RF) amplifiers are a main component of an RF device, such as cell phone, and can define a performance of the RF device in terms of power output and linearity of a transmitted RF signal. In order to keep an RF amplifier performance optimal, as measured for example by some characteristics of the transmitted RF signal, such as linearity, harmonic composition and efficiency, careful design of a corresponding biasing circuitry is necessary. A biasing circuitry however operates on a known input/output characteristic of the RF amplifier at the time of assembly (e.g. production testing) and does not take into account variations due to aging of the various elementary components (e.g. transistors) of the RF amplifier. The teachings according to the present disclosure provide a solution to the drift in biasing of an RF amplifier due to aging of its constituent transistors.

SUMMARY

According to a first aspect of the present disclosure, a radio frequency (RF) amplifier arrangement is presented, the RF amplifier arrangement comprising: a first transistor stack configured, during operation, to amplify an RF signal at an input gate of the first transistor stack and provide an amplified version of the RF signal at an output terminal of the first transistor stack; a second transistor stack configured, during operation, to amplify the RF signal at an input gate of the second transistor stack and provide an amplified version of the RF signal at an output terminal of the second transistor stack; a first switch operatively connected between the output terminal of the first transistor stack and the output terminal of the second transistor stack, the first switch being configured, during operation, to provide a short or an open between the output terminals of the first and second transistor stacks; a second switch operatively connected between the output terminal of the second transistor stack and a first terminal of a resistor, the second switch being configured, during operation, to provide a short or an open between the output terminal of the second transistor stack and the first terminal of the resistor, and a bias control module operatively connected to the first terminal of the resistor via an input sense terminal of the bias control module and operatively connected to the input gate of the first transistor stack and the input gate of the second transistor stack via an output terminal of the bias control module.

According to second aspect of the present disclosure, a radio frequency (RF) amplifier arrangement is presented, the RF amplifier arrangement comprising: a first transistor stack; a second transistor stack, the second transistor stack being a reduced-size replica of the first transistor stack, and a bias control module configured, during operation, to provide a bias voltage in correspondence of a first-stack bias current and a second-stack bias current of the first and second transistor stacks.

According to a third aspect of the present disclosure, a method for compensating drift of a bias current in a radio frequency amplifier is presented, the method comprising: providing a first transistor stack; providing a second transistor stack, the second transistor stack being a reduced-size replica of the first transistor stack; providing a bias voltage to the first and the second transistor stacks in correspondence of a desired first-stack bias current and a desired second-stack bias current of the first and second transistor stacks; coupling the first and second transistor stacks in parallel to provide an amplified RF signal from a common input RF signal; measuring a drift in current of the second-stack bias current; based on the measuring, adjusting the bias voltage to the first and the second transistor stacks, and based on the adjusting, compensating the drift in current of the first-stack and the second-stack bias currents.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1 shows the amplifier arrangement in a "normal mode" of operation.

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

As used in the present disclosure, the terms "switch ON" and "activate" may be used interchangeably and can refer to making a particular circuit element electronically operational. As used in the present disclosure, the terms "switch OFF" and "deactivate" may be used interchangeably and can refer to making a particular circuit element electronically non-operational. As used in the present disclosure, the terms "amplifier" and "power amplifier" may be used interchangeably and can refer to a device that is configured to amplify a signal input to the device to produce an output signal of greater magnitude than the magnitude of the input signal.

The present disclosure describes electrical circuits in electronics devices (e.g., cell phones, radios) having a plurality of devices, such as for example, transistors (e.g., MOSFETs). Persons skilled in the art will appreciate that such electrical circuits comprising transistors can be arranged as amplifiers. As described in a previous disclosure (U.S. patent application Ser. No. 13/797,779), a plurality of such amplifiers can be arranged in a so-called "scalable periphery" (SP) architecture of amplifiers where a total number (e.g., 64) of amplifier segments are provided. Depending on the specific requirements of an application, the number of active devices (e.g., 64, 32, etc.), or a portion of the total number of amplifiers (e.g. $\frac{1}{64}$, $\frac{2}{64}$, 40% of 64, etc.), can be changed for each application. For example, in some instances, the electronic device may desire to output a certain amount of power, which in turn, may require 32 of 64 SP amplifier segments to be used. In yet another application of the electronic device, a lower amount of output power may be desired, in which case, for example, only 16 of 64 SP amplifier segments are used. According to some embodiments, the number of amplifier segments used can be inferred by a nominal desired output power as a function of the maximum output power (e.g. when all the segments are activated). For example, if 30% of the maximum output power is desired, then a portion of the total amplifier segments corresponding to 30% of the total number of segments can be enabled. The scalable periphery amplifier devices can be connected to corresponding impedance matching circuits. The number of amplifier segments of the scalable periphery amplifier device that are turned on or turned off at a given moment can be according to a modulation applied to an input RF signal, a desired output power, a desired linearity requirement of the amplifier or any number of other requirements.

The term "amplifier" as used in the present disclosure is intended to refer to amplifiers comprising single (e.g. stack height of one) or stacked transistors (e.g. stack height greater than one) configured as amplifiers, and can be used interchangeably with the terms "power amplifier (PA)" and "RF amplifier". Such terms can refer to a device that is configured to amplify an RF signal input to the device to produce an output RF signal of greater magnitude than the magnitude of the input RF signal. Stacked transistor amplifiers are described for example in U.S. Pat. No. 7,248,120, issued on Jul. 24, 2007, entitled "Stacked Transistor Method and Apparatus", the disclosure of which is incorporated herein by reference in its entirety. Such amplifier and power amplifiers can be applicable to amplifiers and power amplifiers of any stages (e.g., pre-driver, driver, final), known to those skilled in the art.

As used in the present disclosure, the term "mode" can refer to a wireless standard and its attendant modulation and coding scheme or schemes. As different modes may require different modulation schemes, these may affect required channel bandwidth as well as affect the peak-to-average-ratio (PAR), also referred to as peak-to-average-power-ratio (PAPR), as well as other parameters known to the skilled person. Examples of wireless standards include Global System for Mobile Communications (GSM), code division multiple access (CDMA), Worldwide Interoperability for Microwave Access (WiMAX), Long Term Evolution (LTE), as well as other wireless standards identifiable to a person skilled in the art. Examples of modulation and coding schemes include binary phase-shift keying (BPSK), quadrature phase-shift keying (QPSK), quadrature amplitude modulation (QAM), 8-QAM, 64-QAM, as well as other modulation and coding schemes identifiable to a person skilled in the art.

As used in the present disclosure, the term "band" can refer to a frequency range. More in particular, the term "band" as used herein refers to a frequency range that can be defined by a wireless standard such as, but not limited to, wideband code division multiple access (WCDMA) and long term evolution (LTE).

As used in the present disclosure, the term "channel" can refer to a frequency range. More in particular, the term "channel" as used herein refers to a frequency range within a band. As such, a band can comprise several channels used to transmit/receive a same wireless standard.

In a transistor (e.g. field effect transistor (FET)) under high stress (e.g. large signal swing across its drain-source terminals), charge carriers can become excited (e.g. gain kinetic energy) such that their energy exceeds the conduction band. Such high energy carriers, referred to as "hot carriers", can escape a D-S (e.g. drain-source) conduction band of a FET and enter the gate dielectric (e.g. oxide) where they can become trapped. Such irreversible effect, referred to as hot carrier injection (HCI) and which is well known to the person skilled in the art, may result in a different bias current of the FET than previously exhibited for a same gate bias voltage (e.g. a fixed voltage). In the case where such transistor is used in an amplification stage of an RF amplifier, such change in bias current can affect performance of the RF amplifier, such as measured, for example, by output linearity (e.g. adjacent power leakage ratio (ACLR)) and efficiency (e.g. power added efficiency (PAE)) of the RF amplifier. More information about biasing an RF amplifier and corresponding impact on performance of the amplifier can be found, for example, in the referenced U.S. patent application Ser. No. 13/829,946, which is incorporated herein by reference in its entirety.

It follows that according to an embodiment of the present disclosure, means of compensating such HCI effect in an RF amplifier are provided, such as to provide, in spite of the affecting HCI, a constant biasing (current) to the RF amplifier.

Figure 1:
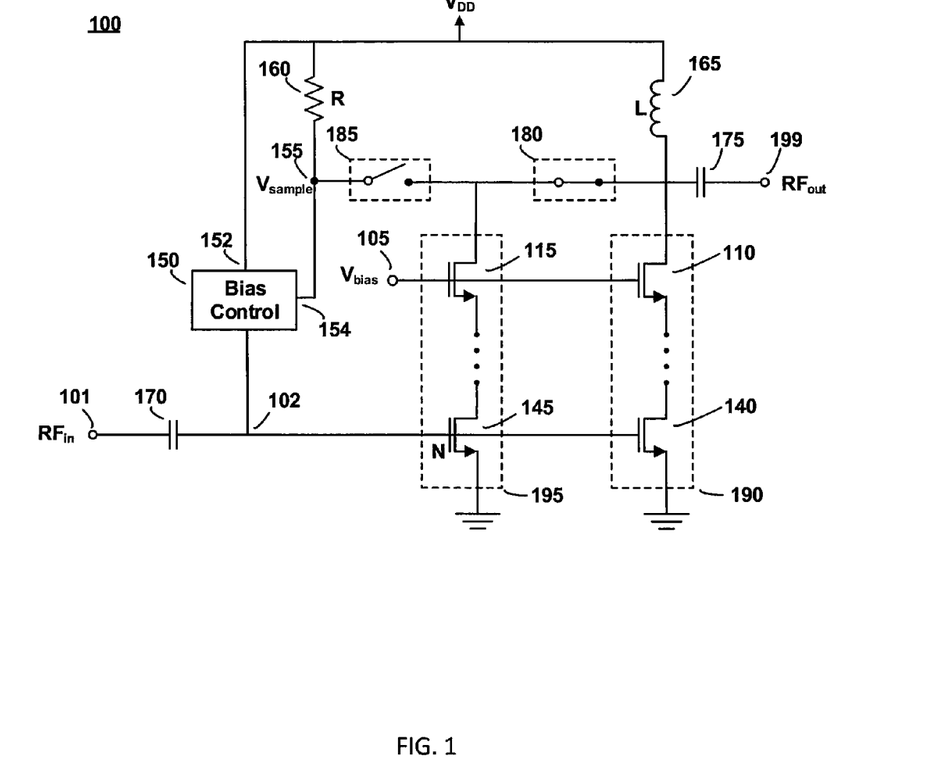
FIG. 1 shows an embodiment according to the present disclosure of a radio frequency (RF) amplifier arrangement which can monitor impact of hot carrier injection on constituent transistors and accordingly adjust a biasing of the amplifier arrangement.

FIG. 1 shows an embodiment according to the present disclosure of an RF amplifier arrangement (100) that can deliver a constant bias current in spite of HCI, or other device degradation mechanisms susceptible to affect a bias current of the device. The arrangement shown in FIG. 1 comprises a first stack (190) of FETs (110, 140, etc.) and a second stack (195) of FETs (115, 145, etc.). The arrangement of FIG. 1 further comprises a first switch (180), a second switch (185), and a bias control module (150). In the embodiment of FIG. 1, power is supplied to the first stack (190) from a voltage supply $V_{DD}$ through an inductor (165). Depending on the state of the first switch (180) and the second switch (185), power can be supplied to the second stack from $V_{DD}$ either through the inductor (165) or a resistor (160). Although the stacks (190, 195) are shown each comprising more than one transistor (FET), such stack height is purely exemplary as teachings according to the present disclosure equally apply to stacks comprising a single transistor each. However, the person skilled in the art will appreciate some of the benefits provided by higher stack heights, such as a power handling capability greater than a power handling capability of a single transistor stack, because a voltage present across a single transistor may be sufficiently high to damage the one transistor, as opposed to dividing the voltage across the multiple transistors of a higher height stack. More information about stacked transistors of height greater than one can be found, for example, in U.S. Pat. No. 7,248,120, issued on Jul. 24, 2007, entitled "Stacked Transistor Method and Apparatus", which is incorporated herein by reference in its entirety. Although not shown in FIG. 1, gate capacitors can be added to the gates of the cascode devices (e.g. FETs above 140 and 145) of the stack, such as to allow gate voltages (voltage across the respective gate capacitor) of the cascode devices (e.g. FETs), respectively, to float, that is let the gate voltages vary along with the RF signal at the drain of the corresponding FETs (e.g. 110, 115), which consequently allow control (e.g. evenly distribute) of the voltage drop across the cascode devices for a more efficient operation of the transistor stacks. See for example, the referenced U.S. Pat. No. 7,248,120, which is incorporated herein by reference in its entirety, for more information.

As depicted in FIG. 1, during a first mode of operation ("normal mode"), a switch control signal u (not shown) can control the first switch (180) to close. At the same time, a switch control signal $\bar{u}$ that is the complement of the switch control signal $\bar{u}$ can control the second switch (185) to open. During the normal mode of operation depicted in FIG. 1, power is supplied to both stacks (190, 195) through the inductor (165). An RF input signal that is applied to an input terminal (101) of the amplifier arrangement (100) can be amplified to produce an RF output signal that is an amplified version of the RF input signal, at an output terminal (199) of the arrangement (100). Biasing of the input transistors (140, 145) of the amplifier arrangement (100) is provided by the bias control module (150) which gets its main input power from the $V_{DD}$ supply at its power input terminal (152). A resistor (160) connected on one side to the power supply $V_{DD}$, is connected to an input sense terminal (154) of the bias control module (150), latter module being configured to measure a voltage at the input sense terminal (154). During the first mode (e.g. normal mode) of operation of the RF amplifier (100) of FIG. 1, switch (185) is open and therefore no current through resistor (160) flows to transistors stack (195). As such, during the first mode, only a very small current $I_{normal}$ may flow through the resistor (160) into the input sense terminal (154), creating a voltage $V_{sample}$ at node (155) which connects to the input (154) of the bias control module (150). Thus the voltage $V_{sample}$ at a sample node (155) during operation in the normal mode is provided by the expression:

$$V_{sample|N} = V_{DD} - R^* I_{normal} \quad (1)$$

It should be noted that since the current $I_{normal}$ can be very small, the second term of the expression (1) can be negligible and practically discarded in some cases and depending on the input stage design of a sensing circuit of the bias control module (150) which senses (e.g. measures) the voltage at the sensing terminal (154). In turn, the bias control module (150) uses the voltage $V_{sample}$ at its input sensing terminal (154) to generate an appropriate bias voltage for input transistors (140, 145) which is then provided, through a common input transistors gate node (102), to the gates of transistors (140, 145) of the amplifier arrangement. In the embodiment according to the present disclosure and as depicted by FIG. 1, control of the current through the transistor stacks (190, 195) can be performed by the voltage applied to the gates of input stack transistors (140, 145), such as provided by the bias control module (150).

It should be noted that in the exemplary case of the embodiment of FIG. 1, biasing of the higher transistors (110, 115, etc.) in the stacks (190, 195) is provided by a fixed bias voltage, $V_{bias}$, applied to a common gate terminal (105) of the transistors, in combination with supplied power supply $V_{DD}$. Although not shown in FIG. 1, transistors at different levels (e.g. height) of the stacks (190, 195) can be provided with a different fixed bias voltage, such as, for example, a third transistor of stack (190) and a third transistor of stack (195) are provided a same third bias voltage, and a fourth transistor of stack (190) and a fourth transistor of stack (195) are provided a same fourth bias voltage different from the third bias voltage. According to other embodiments, the various transistors in the stacks (190, 195) can also be provided with varying bias voltages, such as described, for example, in the referenced U.S. patent application Ser. No. 13/829,946, which is incorporated herein by reference in its entirety.

Figure 2:
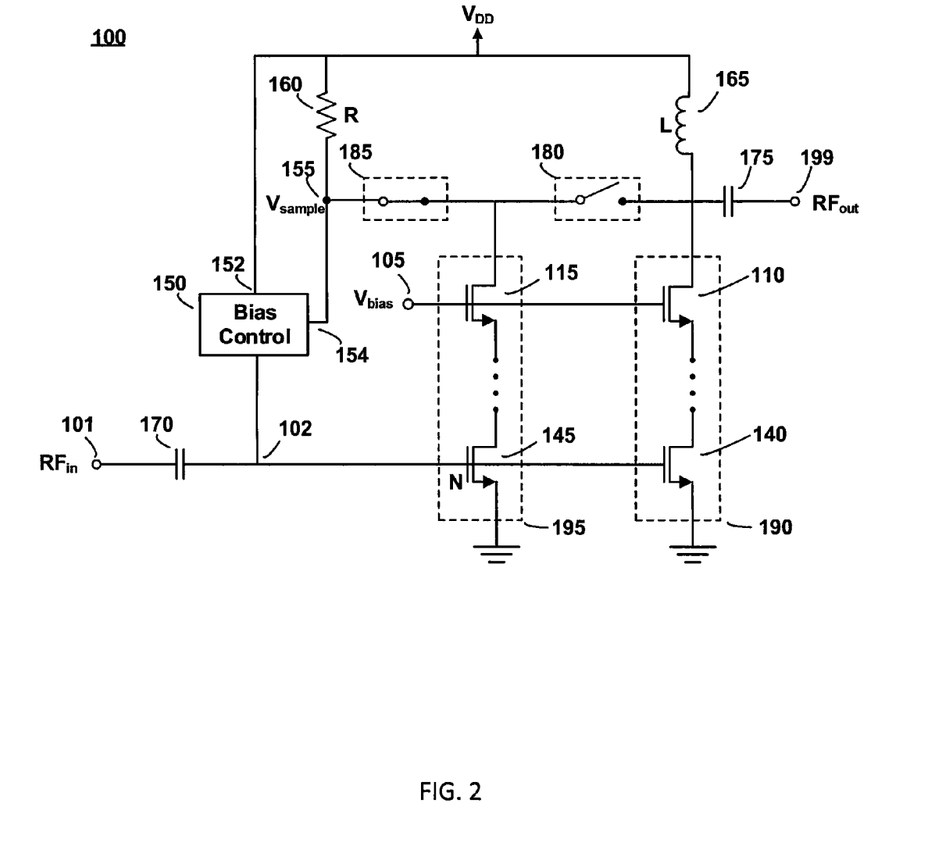
FIG. 2 shows the amplifier arrangement of FIG. 1 in a "sense mode" of operation.

During a second mode of operation ("sense mode") of the RF amplifier arrangement (100) as depicted in FIG. 2, the switch control signal u can be inverted (resulting also in inversion of the switch control signal ū) compared to its status during the normal mode (e.g. FIG. 1), such that the first switch (180) is open. Also, the switch control signal ū can control the second switch (185) to close. During operation in the sense mode, power is supplied to the first stack (190) through the inductor (165), and power is supplied to the second stack (195) through the resistor (160) of resistance value R. It should be noted that when operating in the sense mode (e.g. second mode), there no longer exists a connection between the drain terminals of the transistors (110, 115) of the amplifier arrangement (100). As a result, during operation in the sense mode, an RF signal at the drain of the output transistor (110) of the stack (190) is not present at the input to the bias control module (150).

As a result of power to the second stack (195) being provided via resistor (160) when the RF amplifier arrangement (100) operates in the sense mode, a second stack (195) bias current Ibias flows through the resistor 160. This bias current, which is in addition to the first mode current $I_{normal}$, results in a voltage drop across the resistor (160), such that the voltage $V_{sample}$ at the sample node (155) during operation in the sense mode can be determined according to the expression:

$$V_{sample|S}=VDD-(I_{normal}+I_{bias})*R=V_{sample|N}-I_{bias}*R \quad (2)$$

If the second stack (195) bias current $I_{bias}$ changes due, for example, to HCI, the voltage $V_{sample|S}$ will also change in a predictable manner according to expression (2). Therefore, when operating in the sense mode, the bias control module (150) can adjust the bias voltage applied at the common input transistors gate node (102) in a manner that restores the second stack bias current $I_{bias}$ to an original value (determined by comparing, during operation in the sense mode, $V_{sample}$ at the input sense terminal (154) of the bias control module (150) to an original reference value of $V_{sample}$) in order to offset effects of HCI. Once an adjusted bias voltage is established, this (adjusted) bias voltage can be used during the normal mode of operation of the amplifier arrangement (100), providing a desired bias current to the amplifier arrangement. The reference voltage value to which a current $V_{sample|S}$ is compared during the sense mode can be stored within the bias control module (150) and/or provided to the bias control module (connection not shown).

Since during the normal mode of operation of the amplifier arrangement (100) transistor devices in both stacks (190, 195) are subjected to a same stress (e.g. RF output amplitude), it is reasonable to expect that HCI can affect both set of transistors equally, if both sets comprise same type of transistors (e.g. manufactured using a same technology). Therefore, adjusting the bias voltage at node (102) via monitoring of the voltage $V_{sample|S}$ during the sense mode (e.g. at node (155) and as provided to terminal (154)) as per the previous paragraph can equally offset effects of HCI, or other device (e.g. transistor) degradation mechanisms affecting a bias current through the device, in both first stack (190) and second stack (195). It follows that according to further embodiments of the present disclosure, transistors (115, . . . , 145) and (110, . . . , 140) are monolithically integrated and fabricated on a same die using a same technology. Some manufacturing examples and related technologies for fabricating such stacked transistors are described, for example, in the referenced U.S. Pat. No. 7,248,120, which is incorporated herein by reference in its entirety.

Figure 4:
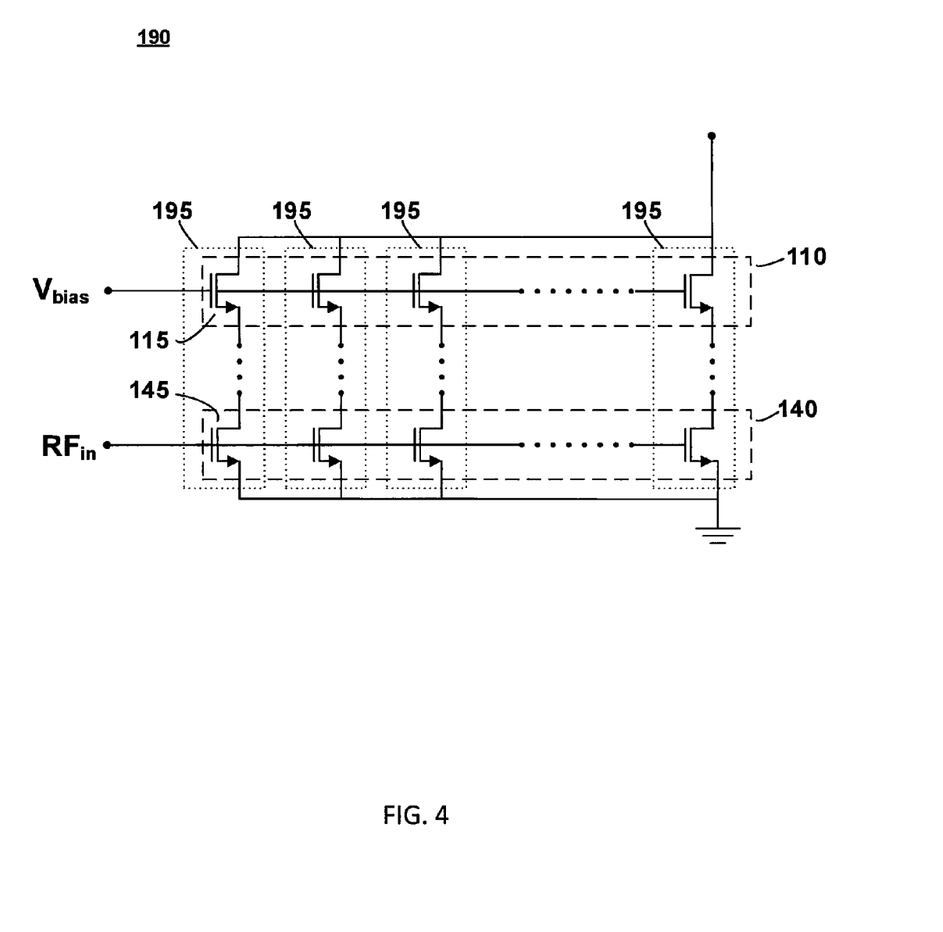
FIG. 4 shows a relationship between a main stacked transistors arrangement and a replica stacked transistors arrangement of the RF amplifier arrangement of FIGS. 1 and 2, where the main stacked transistors arrangement is used for amplification in the "normal mode" of operation, and the replica stacked transistors arrangement is used for the sensing in the "sense mode" of operation.

As known by the person skilled in the art, methods for increasing an output power capability of an amplifier integrated circuit (IC) comprise increasing the size (e.g. number) of its constituents (e.g. transistors) by creating, for example, a sea of transistors which are connected in a way to increase current capability of the amplifier. For example, the stacked transistor arrangement (190) can comprise a large number of "segments" combined in a parallel fashion for an increased output power capability (e.g. current), each segment being composed of a stacked arrangement of single transistor devices as depicted in FIG. 4. The stacked arrangement (190) depicted in FIG. 4, comprises a plurality of unit segments (195) arranged in a cascaded configuration (e.g. parallel), where each unit segment (195) comprises a stacked arrangement of transistors (115, . . . , 145), where each transistor (115, . . . , 145) can be a single transistor device. The parallel combination of single segments (195) (e.g. increasing the size) provides for an increased power capability of the stacked arrangement (190), as a current flowing through the arrangement (190) can be the sum of individual currents flowing through each segment. As the unit segments (195) are monolithically integrated, it is reasonable to expect that current flowing through each unit segment is substantially the same for a given biasing of the stacked arrangement (190), as each unit segment has a same set of electrical characteristics by virtue of monolithic integration. It should be noted that the stacked arrangement (190) of FIG. 4 can comprise 100 to 1000 or more unit segments (195), as dictated, for example, by a desired output power rating of the stacked arrangement (190). Electrically, one can consider the unit segment (195) as a reduced size (e.g. scaled down) replica of the stacked segment (190), with a scaled down (e.g. proportional to relative size) bias current (e.g. for a given biasing) and power consumption when compared to the stacked segment (190).

Furthermore, by virtue of their same biasing and common output (e.g. drain of FETs 115), all unit segments (195) of the stacked arrangement (190) and their constituent FETs (115, . . . 145) are equally stressed during operation of the stacked arrangement (190) and therefore are subject to a same level of HCI, or other related device degradation mechanism.

Figure 3:
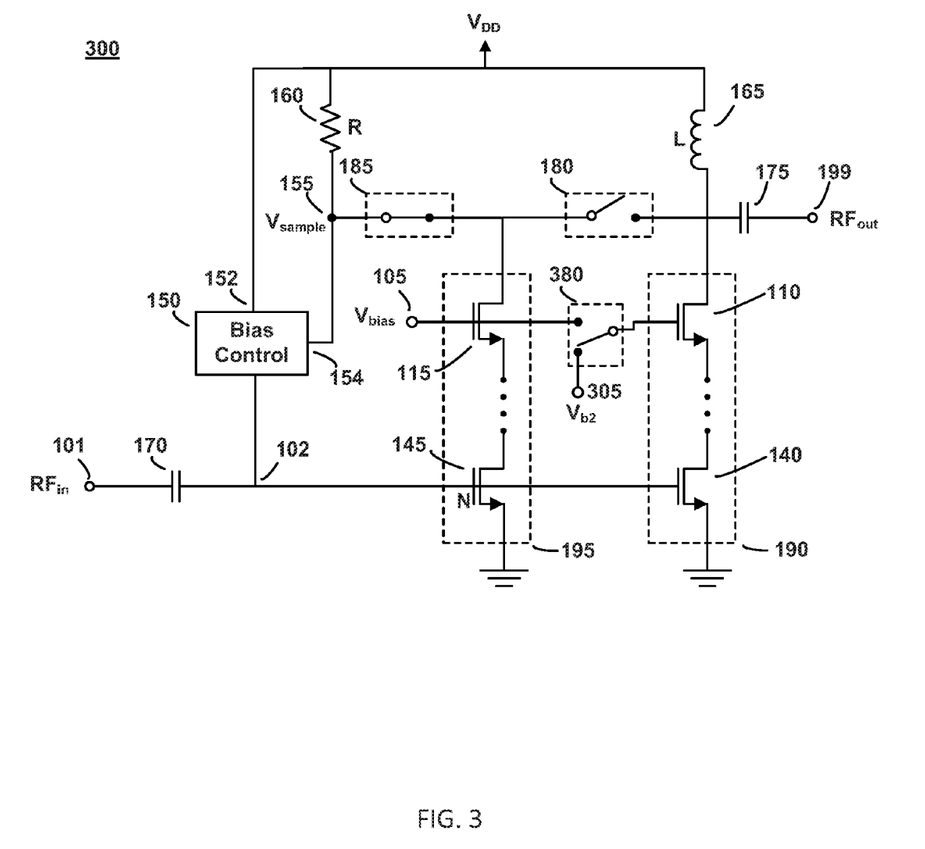
FIG. 3 shows the amplifier arrangement of FIG. 2 wherein an additional switch can be used to modify a biasing of a first transistor stack of the RF amplifier arrangement.

It follows that according to a further embodiment of the present disclosure, the second stack (195) of FETs of FIGS. 1 and 2 can be the unit segment (195) used in the first stack (190) of FETs as depicted by FIG. 4. This embodiment according to the present disclosure allows monitoring HCI, or other device degradation mechanism, on a sample constituent of the first stack while consuming a reduced power (e.g. from battery of a cellular phone). Using a single unit segment during the sense mode can be beneficial as it allows using a reduced amount of power (e.g. from battery via resistor (160)). For example, the sense mode can be performed during a time of no transmission (e.g. of an RF device which uses the RF amplifier arrangement of FIGS. 1 and 2), and therefore can maintain a low power consumption during operation in the sense mode. Furthermore, and according to an embodiment of the present disclosure, while operating in the sense mode during a time of no transmission (e.g. no RF signal being transmitted), drain current through the first stack (190) can be further reduced by providing a different bias voltage to the stack transistors other than the input transistor (140) (e.g. cascode devices). This can be done by providing, for example, an additional switch which decouples higher stack transistors (110, . . . ) of the first stack (190) from the common Vbias voltage provided at node (105), as depicted in the amplifier arrangement (300) of FIG. 3. In the embodiment according to the present disclosure and depicted in FIG. 3, the switch (380) can be used to select either the Vbias voltage (e.g. common to the second transistor stack, during for example a normal mode of operation of the amplifier arrangement) provided at terminal (105) or a second bias voltage (Vb2) provided at terminal (305) of the arrangement (300). The second bias voltage (Vb2) can be selected such as to reduce the drain current through the transistor stack (190) while, for example, operating the amplifier arrangement in the sense mode. The person skilled in the art can find other methods to reduce drain current in the first stack during a time of no transmission.

Alternatively, and according to further embodiments of the present disclosure, operation in the sense mode can also be performed during a transmission with minimal impact on the transmitted signal. As a contribution to an amplified $RF_{out}$ signal at terminal (199) of the amplifier arrangement (100) by the single unit segment (195) is negligible (e.g. size of about $\frac{1}{100}^{th}$ or less of 190), removing the second stack (195) from the amplification stage (e.g. via switch 180 during the sense mode) can have a reduced effect on the amplifier $RF_{out}$ signal. Furthermore and as previously mentioned, by virtue of the switch (180), the biasing control module (150) remains immune from an effect of an RF signal at the drain terminal of transistor (110) of the stack (190) during the sense mode, and therefore consistent HCI measurement per the provided methods in the previous paragraphs can be made during an RF transmission (e.g. amplification) of the arrangement (100). Finally, as an RF transmission can include bursts of RF transmission with transmission interruption in-between the bursts, a signal-aware controller (e.g. a transceiver) can control operation of the amplifier arrangement (100) such as to perform HCl compensation via the sense mode operation during either the transmission bursts or the no transmission periods (e.g. transmission interruption in-between the bursts).

As previously mentioned, the various exemplary embodiments of the present disclosure are not limited to stacked arrangement of FETs (190, 195) comprising more than one FET transistors, as amplifier arrangements (100) comprising stacked arrangement (190, 195) of a single FET height can also benefit from the teachings of the present disclosure. According to an exemplary embodiment of the present disclosure, stacks (190) and (195) each include a single transistor, with a size ratio of about $\frac{1}{100}^{th}$ to $\frac{1}{1000}^{th}$ or more, to which the bias control module (150) provides an adjustable biasing voltage to counter the effects of HCl, or other device (e.g. transistor) degradation mechanisms affecting a bias current through the device, over the single transistor of the stacks.

In the various embodiments according to the present disclosure as depicted in FIGS. 1 and 2, the various switches (180, 185) can be controlled via a controller unit aware of the operation of the amplifier arrangement (100). According to further embodiments of the present disclosure, such controller unit can also be aware of an RF signal to be amplified via the amplifier arrangement (100), such as to allow control of the switches during various phases of the RF signal (e.g. no transmission, transmission). As previously mentioned, such controller unit can be a transceiver unit used in data/voice communication systems as known to the skilled person.

According to a further embodiment of the present disclosure, the amplifier arrangement (100) depicted in FIGS. 1 and 2 can be monolithically integrated in its entirety within a same integrated circuit. According to further embodiments of the present disclosure, partial monolithic integration of the amplifier arrangement (100) can also be performed, such as, for example, leave out capacitors (170, 175). The skilled person will find other combination components from FIGS. 1-2 for monolithic integration and as better suited for a targeted integration.

Figure 5:
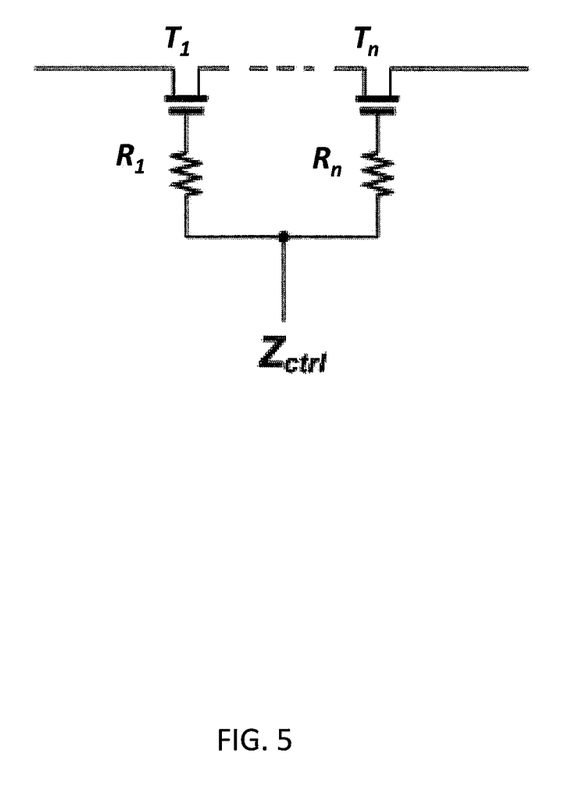
FIG. 5 shows an exemplary embodiment of a switch with stacked transistors.

By way of further example and not limitation, any switch or switching circuitry of the present disclosure, such as switches (180, 185) of FIGS. 1 and 2 can be implemented using transistors, stacked transistors (FETs), diodes, or any other devices or techniques known to or which can be envisioned by a person skilled in the art. In particular, such switching circuitry can be constructed using CMOS technology and various architectures known to the skilled person, such as, for example, architecture presented in U.S. Pat. No. 7,910,993, issued on Mar. 22, 2011 and entitled "Method and Apparatus for use in Improving Linearity of MOSFET's using an Accumulated Charge Sink", and in U.S. Pat. No. 6,804,502, issued on Oct. 12, 2004 and entitled "Switch Circuit and Method of Switching Radio Frequency Signals", both incorporated herein by reference in their entirety. FIG. 5 shows an exemplary embodiment of a single-pole single-throw switch with stacked transistors ($T_1$, . . . , $T_n$), which the skilled person can use as an elementary component of the various switches used in the various embodiments according to the present disclosure.

Although the stacked transistor arrangements (190, 195) are shown as comprising a plurality of stacked FET transistors (e.g. MOSFETs), a person skilled in the art would recognize that either P-type or N-type MOSFETs may be used. The person skilled in the art would also recognize that other types of transistors such as, for example, bipolar junction transistors (BJTs) can be used instead or in combination with the N-type or P-type MOSFETs. Furthermore, a person skilled in the art will also appreciate the advantage of stacking more than two transistors, such as three, four, five or more, provide on the voltage handling performance of the switch. This can for example be achieved when using non bulk-Silicon technology, such as insulated Silicon on Sapphire (SOS) technology and silicon on insulated (SOI) technology. In general, the various switches used in the various embodiments of the present disclosure can be constructed using CMOS, silicon germanium (SiGe), gallium arsenide (GaAs), gallium nitride (GaN), bipolar transistors, or any other viable semiconductor technology and architecture known, including micro-electro-mechanical (MEM) systems. Additionally, different device sizes and types can be used within a stacked transistor switch such as to accommodate various current handling capabilities of the switch.

The examples set forth above are provided to give those of ordinary skill in the art a complete disclosure and description of how to make and use the embodiments of the present disclosure, and are not intended to limit the scope of what the inventors regard as their disclosure. Modifications of the above described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

The invention claimed is:

1. A radio frequency (RF) amplifier arrangement configured to operate in one of at least two modes of operation, the RF amplifier arrangement comprising:
a first transistor stack; and
a second transistor stack, the second transistor stack being a reduced-size replica of the first transistor stack,
wherein:
during the first mode of operation, the first transistor stack and the second transistor stack operate in parallel as a single amplifier to provide an output RF signal at an amplifier output node that is coupled to an output node of the first transistor stack and to an output node of the second transistor stack, the amplifier output node coupled to a supply voltage through an inductor to provide power to the first and the second transistor stacks, and
during the second mode of operation, the output node of the second transistor stack is decoupled from the amplifier output node so that the first and the second transistor stacks operate as separate amplifiers, the output node of the first transistor stack is coupled to the amplifier output node and the output node of the second transistor stack is coupled to the supply voltage through a resistor to respectively provide power to the first transistor stack and to the second transistor stack.

2. The RF amplifier arrangement of claim 1, wherein biasing of the first transistor stack and of the second transistor stack during the first mode of operation is based on a sensed voltage at the output node of the second transistor stack during the second mode of operation.

3. The RF amplifier arrangement of claim 2, further comprising a bias control module configured to adjust the biasing of the first transistor stack and the second transistor stack based on the sensed voltage at the output node of the second transistor stack during the second mode of operation.

4. The RF amplifier arrangement of claim 3, wherein:
the sensed voltage at the output node of the second transistor stack during the second mode of operation is in correspondence of a bias current through the second transistor stack, and
the bias control module is configured to measure a drift of the bias current through the second transistor stack based on the sensed voltage at the output node of the second transistor stack during the second mode of operation.

5. The RF amplifier arrangement of claim 4, wherein:
the bias control module adjusts biasing voltages to the first transistor stack and to the second transistor stack based on the measured drift of the bias current through the second transistor stack so as to maintain a desired bias current through the first transistor stack and the second transistor stack during the first mode of operation.

6. The RF amplifier arrangement of claim 1, further comprising a first switch, wherein, during the second mode of operation, the first switch is configured to decouple the amplifier output node from the bias control module.

7. The RF amplifier arrangement of claim 1, wherein during the second mode of operation, the amplifier output node is the output node of the first transistor stack and the output RF signal of the RF amplifier arrangement is provided at the output node of the first transistor stack.

8. The RF amplifier arrangement of claim 7, further comprising a second switch, wherein the second switch is configured to provide a short between the output node of the first transistor stack and the output node of the second transistor stack during the first mode of operation, and to provide an open between the output node of the first transistor stack and the output node of the second transistor stack during the second mode of operation.

9. The RF amplifier arrangement of claim 1, wherein a ratio of a size of the first transistor stack to a size of the second transistor stack is about 100 or more, such as a current flow and a power consumption of the second transistor stack is about $\frac{1}{100}^{th}$ or less of a current flow and power consumption of the first transistor stack.

10. The RF amplifier arrangement of claim 1, wherein the first transistor stack and the second transistor stack are monolithically integrated on a same integrated circuit.

11. The RF amplifier arrangement of claim 10, wherein the RF amplifier arrangement is monolithically integrated on a same integrated circuit partially or in its entirety.

12. The RF amplifier arrangement of claim 10 or 11 fabricated using a technology comprising one of: a) silicon on sapphire, b) silicon on insulator, and c) bulk-silicon.

13. The RF amplifier arrangement of claim 1, wherein selection of the mode of operation is performed by a signal-aware controller unit according to a presence or an absence of an RF signal at an input gate of the first and the second transistor stacks.

14. The RF amplifier arrangement of claim 13, wherein operation in the second mode is performed in one of: a) during a time where no RF signal is present at the input gate of the first and second transistor stacks, and b) during a time where an RF signal is present at the input gate of the first and the second transistor stacks.

15. The RF amplifier arrangement of claim 14, further comprising a switch configured, during operation in the second mode which coincides with a), to reduce a current flow through the first transistor stack.

16. The RF amplifier arrangement of claim 15, wherein the switch is configured, during operation of the RF amplifier arrangement, to provide one of at least two bias voltages to transistors of the first transistor stack other than an input transistor in correspondence of the input gate of the first transistor stack.

* * * * *